(12) United States Patent
Stevens et al.

(10) Patent No.: US 7,728,277 B2
(45) Date of Patent: Jun. 1, 2010

(54) PMOS PIXEL STRUCTURE WITH LOW CROSS TALK FOR ACTIVE PIXEL IMAGE SENSORS

(75) Inventors: Eric G. Stevens, Webster, NY (US); Hirofumi Komori, Kanagawa (JP)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/455,985

(22) Filed: Jun. 20, 2006

(65) Prior Publication Data
US 2007/0108371 A1 May 17, 2007

Related U.S. Application Data

(60) Provisional application No. 60/737,298, filed on Nov. 16, 2005.

(51) Int. Cl.
*H01L 31/00* (2006.01)

(52) U.S. Cl. .............. 250/214.1; 250/214 DC; 257/292; 257/436; 257/461; 348/281; 348/308

(58) Field of Classification Search .......... 250/214.1, 250/214 R, 214 DC; 257/231, 233, 239, 257/292, 431, 436, 461; 348/281, 282, 308
See application file for complete search history.

(56) References Cited

U.S. PATENT DOCUMENTS

| | | | |
|---|---|---|---|
| 4,142,195 A * | 2/1979 | Carlson et al. | ............ 257/54 |
| 4,527,182 A | 7/1985 | Ishihara et al. | |
| 5,608,204 A | 3/1997 | Höfflinger et al. | |
| 5,880,495 A * | 3/1999 | Chen | ............ 257/233 |
| 5,898,196 A | 4/1999 | Hook et al. | |
| 6,023,081 A | 2/2000 | Drowley et al. | |
| 6,023,293 A | 2/2000 | Watanabe et al. | |
| 6,084,259 A | 7/2000 | Kwon et al. | |

(Continued)

FOREIGN PATENT DOCUMENTS

DE  199 33 162 B4  11/2004

(Continued)

OTHER PUBLICATIONS

Endo et al., "4-micro pixel CMOS image sensor with low image lag and high-temperature operability," *Sensors and Camera Systems for Scientific, Industrial, and Digital Photography Applications*, Proceedings of SPIE-IS&T Elec. Imaging, SPIE vol. 5017 (2003). pp. 196-204.

(Continued)

*Primary Examiner*—Georgia Y Epps
*Assistant Examiner*—Francis M Legasse, Jr.
(74) *Attorney, Agent, or Firm*—Peyton G. Watkins; Nancy R. Simon (57) ABSTRACT

An image sensor with an image area having a plurality of pixels with each pixel having a photodetector and a substrate of a first conductivity type and a first layer of a second conductivity type formed between the substrate and the photodetectors. The first layer spans the image area and is biased at predetermined potential with respect to the substrate for driving excess carriers into the substrate to reduce cross talk. One or more adjacent active electronic components can be disposed in the first layer within each pixel and electronic circuitry can be disposed in the substrate outside of the image area.

19 Claims, 11 Drawing Sheets

U.S. PATENT DOCUMENTS

| | | | |
|---|---|---|---|
| 6,107,655 | A | 8/2000 | Guidash |
| 6,150,682 | A | 11/2000 | Sawada et al. |
| 6,225,670 | B1 | 5/2001 | Dierickx |
| 6,504,196 | B1 * | 1/2003 | Rhodes ................. 257/292 |
| 6,512,547 | B1 * | 1/2003 | Miida ................... 348/310 |
| 7,253,461 | B2 * | 8/2007 | Yang et al. ............. 257/292 |
| 7,307,327 | B2 * | 12/2007 | Bahl et al. ............. 257/446 |
| 2003/0090584 | A1 * | 5/2003 | Goto ..................... 348/299 |
| 2003/0138990 | A1 | 7/2003 | Rhodes |
| 2004/0094784 | A1 * | 5/2004 | Rhodes et al. ........... 257/291 |
| 2004/0140491 | A1 * | 7/2004 | Rhodes et al. ........... 257/292 |
| 2004/0206991 | A1 | 10/2004 | Yato |
| 2004/0222449 | A1 | 11/2004 | Koyama |
| 2005/0087672 | A1 | 4/2005 | Kuwazawa et al. |
| 2008/0217716 | A1 * | 9/2008 | Mauritzson ............. 257/443 |

FOREIGN PATENT DOCUMENTS

| | | |
|---|---|---|
| DE | 19933162 B4 | 11/2004 |
| EP | 0917206 A1 | 5/1999 |
| EP | 1128437 | 1/2008 |
| EP | 0809299 | 4/2008 |
| GB | 2332049 A | 6/1999 |
| WO | WO 00/99994 | 1/2000 |

OTHER PUBLICATIONS

S. Inoue et al., "A 3.25 M-pixel APS-C size CMOS Image Sensor," in Eizojoho Media Gakkai Gijutsu Hokoku (Technology Report, The Institute of Image Information and Television Engineers) Eijogakugiho, vol. 25, No. 28, pp. 37-41, Mar. 2001. ISSN 1342-6893. (Translation provided).

E.G. Stevens and J.P. Lavine in *IEEE Trans. on Electron Devices*, vol. 41, No. 10, p. 1753-1760, Oct. 1994.

George Lungu et al., "Design, Fabrication and Characterization of a Family of Active Pixel CID Images," Proceedings SPIE 1999, vol. No. 3649, pp. 67-73.

Furumiya et al., "High Sensitivity and No-Cross-Talk Pixel Technology for Embedded CMOS Image Sensor", International Electron Devices Meeting 2000. IEDM Technical Digest, San Francisco, CA, Dec. 10-13, 2000. pp. 701-704 ISBN: 0-7803-6439-2.

* cited by examiner

PMOS PIXEL STRUCTURE WITH LOW CROSS TALK FOR ACTIVE PIXEL IMAGE SENSORS

CROSS-REFERENCE TO RELATED APPLICATIONS

Reference is made to and priority claimed from U.S. Provisional Application Ser. No. 60/737,298, filed Nov. 16, 2005, entitled PMOS PIXEL STRUCTURE WITH LOW CROSS TALK FOR ACTIVE-PIXEL IMAGE SENSORS.

FIELD OF THE INVENTION

The invention relates generally to the field of image sensors, and in particular to active pixel image sensors having an n-type pinning layer and a p-type collection region in an n-type well for reducing cross talk.

BACKGROUND OF THE INVENTION

Current day active pixel image sensors are typically built on either p- or n-type silicon substrates. Active pixel sensors refer to sensors having an active circuit element such as an amplifier in, or associated with, each pixel. CMOS refers to "complimentary metal oxide silicon" transistors in which two transistors composed of opposite dopants (one of p-type and one of n-type) are wired together in a complimentary fashion. Active pixel sensors also typically use CMOS transistors, and as such, are used interchangeably.

The CMOS sensors built on p-type substrates typically contain a higher level of circuit integration on chip due to the fact that the process is derived from standard CMOS, which is already fully developed and contains all the necessary devices and circuit libraries to support this high level of integration. Unfortunately, these sensors suffer from high levels of pixel-to-pixel cross talk that results from the lateral diffusion of minority carriers within the p-type substrates on which they are built. On the other hand, CMOS image sensors built using processes derived from typical interline CCD image sensors, (wherein the focal plane is built in a p-well on an n-type substrate), have much lower cross talk due to the elimination of lateral carrier diffusion as a result of the vertical-overflow drain (VOD) structure. For these devices, color cross talk is primarily optical as limited by the transmission of the overlying CFAs.

Although there have been several recent proposals to reduce the electrical cross talk within the silicon substrates for CMOS sensors built on p-type substrates, (U.S. Provisional Application Nos. 60/721,168 and 60/721,175, both filed on Sep. 28, 2005), the cross talk can not be reduced low enough using these techniques for certain applications. And although a CMOS process could be developed on n-type substrates, it would require the complete re-engineering of all of the support circuitry and devices. It would also require that the AC ground plane, in this case the substrate, be biased at the VDD supply voltage, which is not desirable from a noise point of view. N-type substrates are also more difficult to getter than p-type substrates, which can result in a higher level of dark current defects.

Therefore, there exists a need within the art to provide a CMOS image sensor with reduced cross talk while maintaining all of the current advantages and level of development of existing mainstream CMOS processes.

SUMMARY OF THE INVENTION

The present invention is directed to overcoming one or more of the problems set forth above. Briefly summarized, according to one aspect of the present invention, the present invention resides in an image sensor with an image area having a plurality of pixels each having a photodetector of a first conductivity type, the image sensor comprising a substrate of the first conductivity type; a first layer of the second conductivity type between the substrate and the photodetectors, spanning the image area and biased at predetermined potential with respect to the substrate for driving excess carriers into the substrate to reduce cross talk; one or more adjacent active electronic components disposed in the first layer within each pixel; and electronic circuitry disposed in the substrate outside of the image area.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention has the advantage of reducing cross talk and the bulk-diffusion component of dark current while retaining all the advantages of using mainstream standard CMOS integrated on a p-type substrate.

BRIEF DESCRIPTION OF THE DRAWINGS

FIG. 4b shows a top view of an exemplary layout for the image sensor of FIG. 4a;

DETAILED DESCRIPTION OF THE INVENTION

Historically, charge-coupled device (CCD)-based image sensors have primarily used electrons as the signal-charge carrier to take advantage of their higher mobility to maintain good transfer efficiency at high data rates. To reduce color cross talk and smear, and to provide blooming protection, CCD imagers are also typically built in a well, or vertical-overflow drain (VOD) structure (see for example U.S. Pat. No. 4,527,182). Therefore, building a VOD structure along with the requirement for an n-channel requires that a p-well be formed in an n-type substrate.

CMOS-based image sensors have since become more readily available. Current day CMOS image sensors are typically built on either p- or n-type silicon substrates. Those built on p-type substrates using mainstream CMOS processing can contain high levels of circuit integration, but suffer from high levels of color cross talk. Those built using a typical CCD-like process on n-type substrates (S. Inoue et al., "A 3.25 M-pixel APS-C size CMOS Image Sensor," in Eizojoho Media Gakkai Gijutsu Hokoku (Technology Report, The Institute of Image Information and Television Engineers) Eijogakugiho, vol. 25, no. 28, pp. 37-41, March 2001. ISSN 1342-6893.) have low color cross talk, but have other shortcomings as previously described above.

Unlike CCD image sensors, CMOS image sensors have only one transfer, i.e., from the photodiode to the floating diffusion. Hence, a CMOS image sensor does not require as high a charge carrier mobility. As such, the lower mobility of holes would not be a deficiency for a CMOS image sensor. It is therefore one object of the present invention to disclose a CMOS image sensor employing a PMOS (p-channel) pixel structure using holes as the signal-charge carrier. This PMOS structure of the present invention allows the pixel to be built in an n-well on p-type epi to reduce pixel-to-pixel cross talk. However, unlike a typical CCD-based image sensor, this well is only used underneath (or spanning) the imaging section of the sensor. All of the digital and analog CMOS support circuitry integrated on the chip is formed in the p-type epi (see FIG. 4b, i.e., analog or digital circuits 80, digital logic 90, row decoder 100, and column decoder 110). This means that all of the physical aspects of the devices in the standard CMOS circuitry portion of the chip are retained. Additionally, unlike the CCD image sensors built in a well wherein this well is biased at ground and the substrate at some positive potential, by biasing the n-well of the present invention structure at VDD, the ground plane (i.e., the p-type epitaxial substrate) for the CMOS circuitry can be maintained at 0 V. This means that all of the electrical aspects of the standard CMOS circuitry portions of the chip are also retained. Only the direction of some logic pulses and the signal swing(s) in the digital and analog sections need to be inverted where appropriate, which is readily accomplished by those skilled in the art. Therefore, all of the advantages of p-type substrates mentioned above in the Background section are retained. The well-type structure also reduces dark current by eliminating the diffusion component from the substrate.

Figure 1:
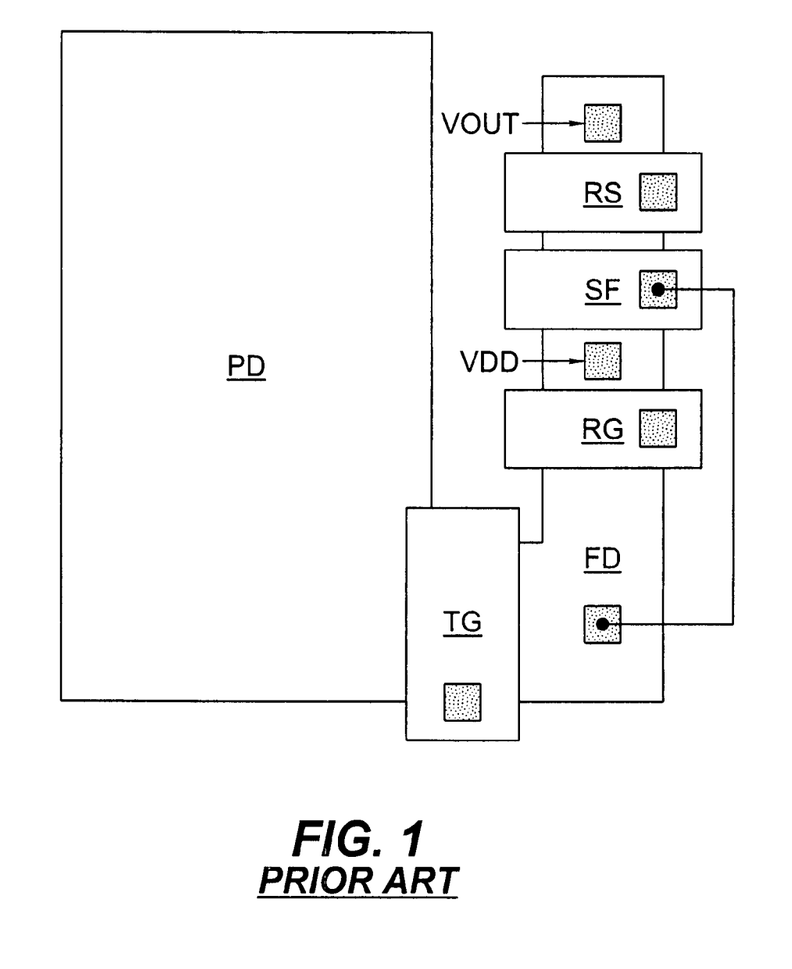
FIG. 1 shows the top view of an image-area pixel used in a typical prior art CMOS image sensor.

The top view of a typical prior art CMOS image sensor pixel is shown in FIG. 1. The typical pixel consists of a photodiode (PD); a transfer gate (TG) for reading charge out of the photodiode; a floating diffusion (FD) for converting the signal charge into a voltage signal; a source-follower transistor (SF) which acts as a signal buffer whose gate is electrically connected to FD; a row-select transistor (RS) that selectively connects the outputs of the source-follower transistors to the column output circuits (not shown in FIG. 1); and a reset gate (RG) for resetting the potential of the floating diffusion. A power supply voltage (VDD) is used to power the source follower and drain off signal charge from the floating diffusion during its reset operation.

Figure 2A:
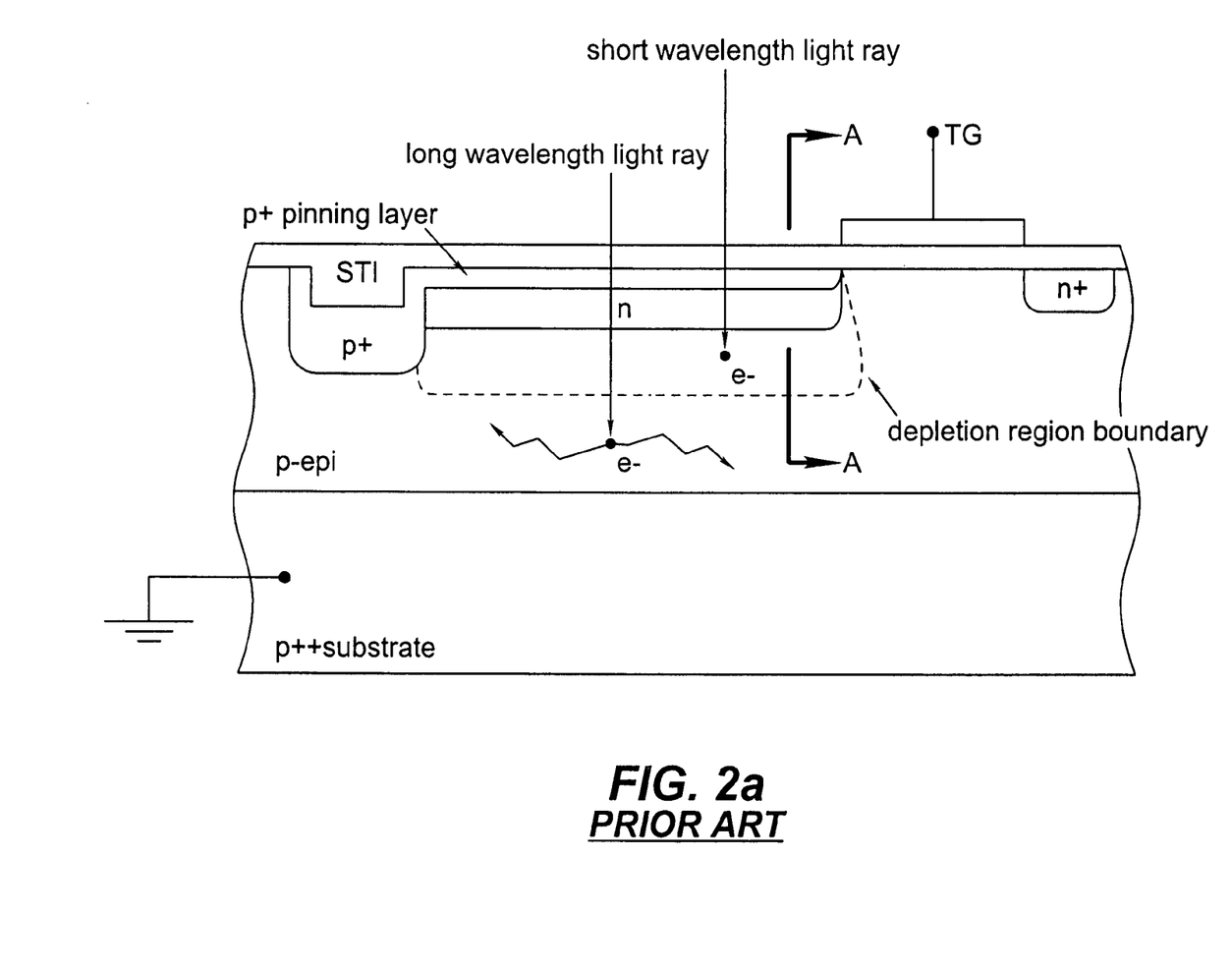
FIG. 2a shows a schematic view of a two-dimensional doping structure taken through a cross section through the transfer gate and floating diffusion of a typical prior art pinned photodiode detector.
Figure 2B:
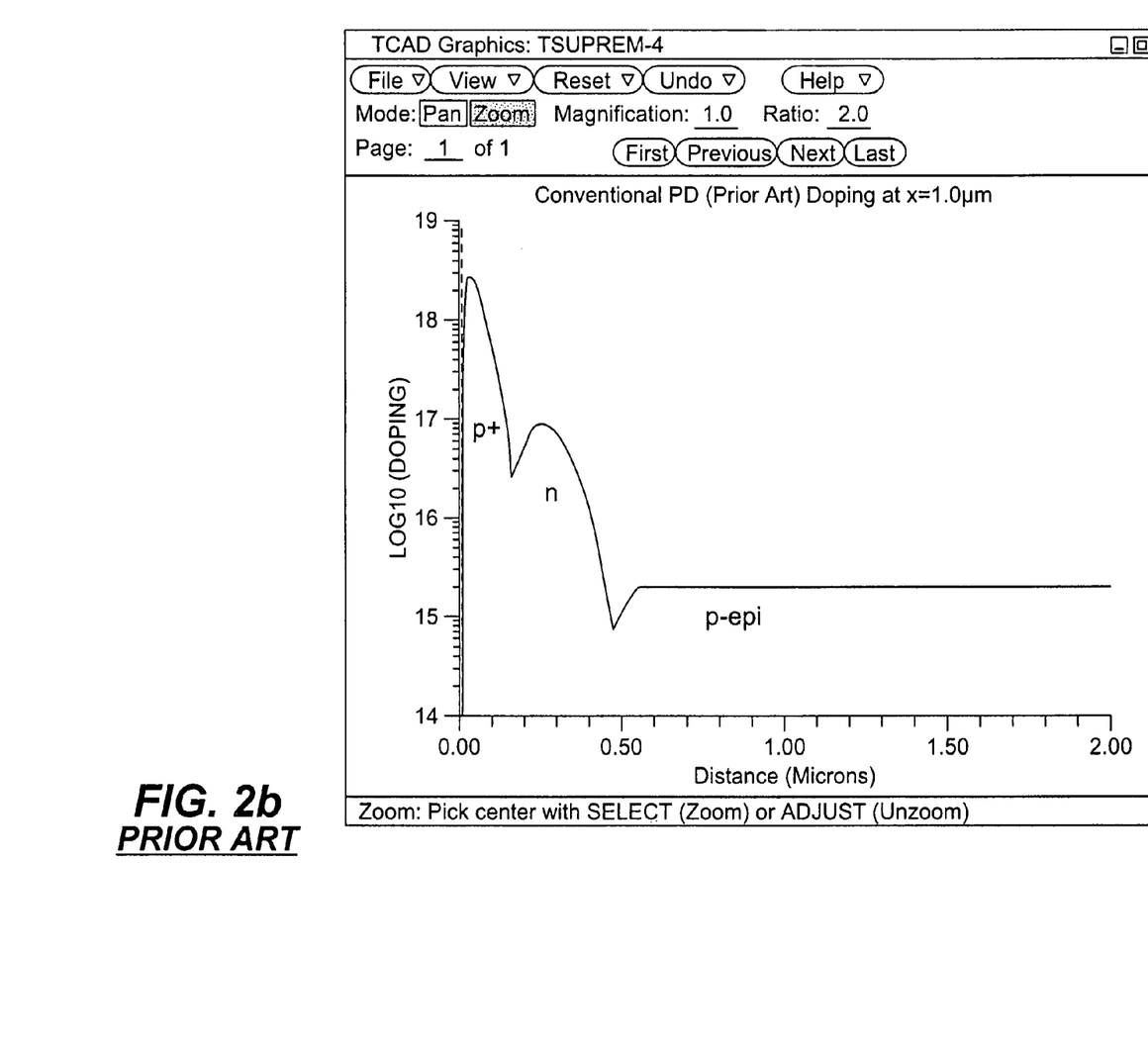
FIG. 2b shows the 1-D doping profile vs. depth into the silicon through the middle of the prior art photodiode.
Figure 2C:
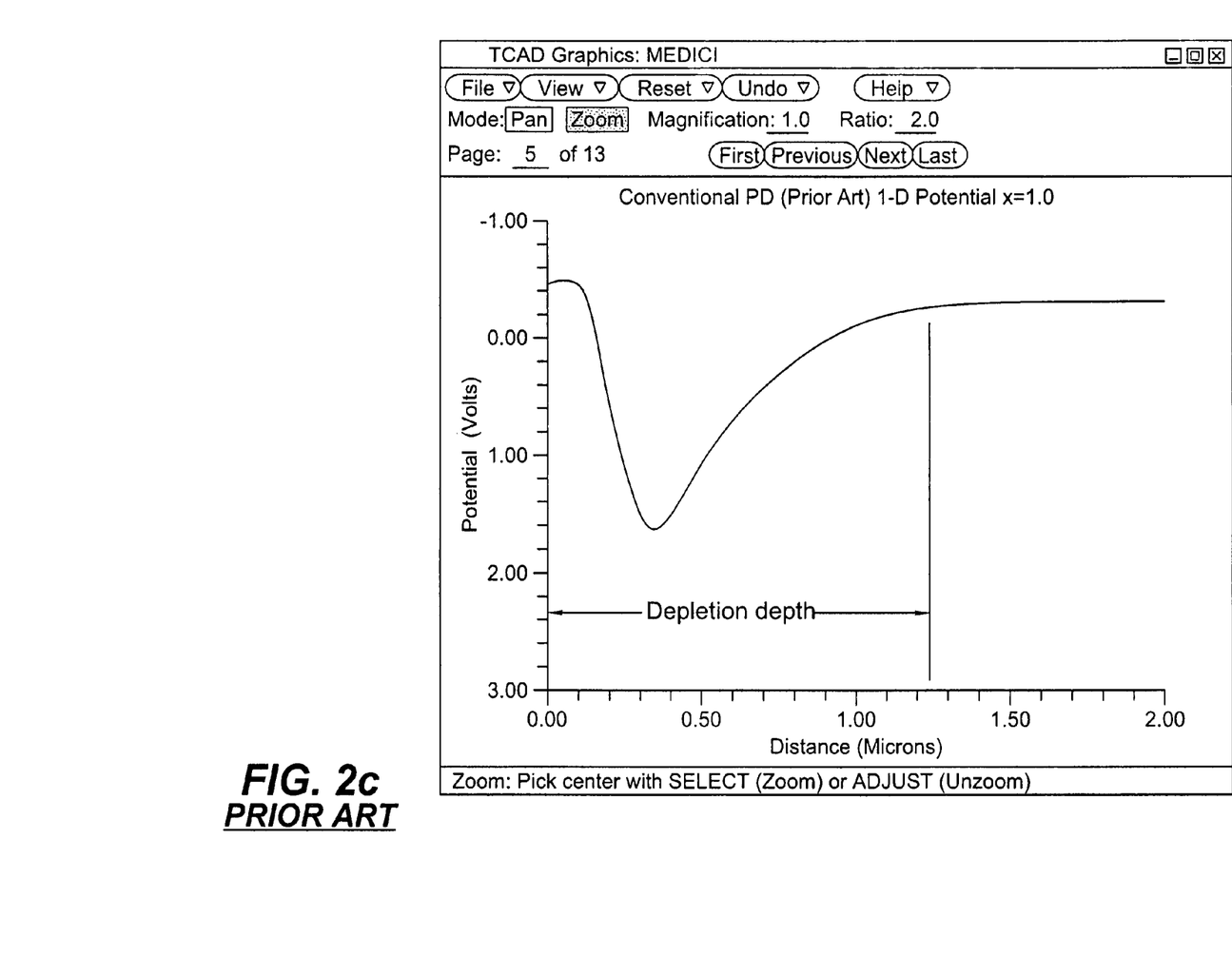
FIG. 2c shows the 1-D potential profile vs. depth into the silicon through the middle of the prior art photodiode.

A typical prior art CMOS image sensor pixel contains a pinned photodiode with a p+ type pinning layer and an n-type storage region built on p−/p++ epitaxial silicon wafers as illustrated by way of example in FIGS. 2a-2c. The depletion region depth (shown in FIGS. 2a and 2c) defines the collecting boundary of the photodiode. An example doping profile down through the center of the prior art photodiode is shown in FIG. 2b. Charge carriers (electrons) generated from shorter wavelength light that are created within the collecting region (i.e., depletion region boundary) are captured and stored as signal charge. Charge carriers generated from longer wavelengths that are created past this depletion depth are free to diffuse in any direction via thermal diffusion. Any charge that diffuses laterally and gets collected by adjacent pixels is called electrical cross talk.

Figure 3:
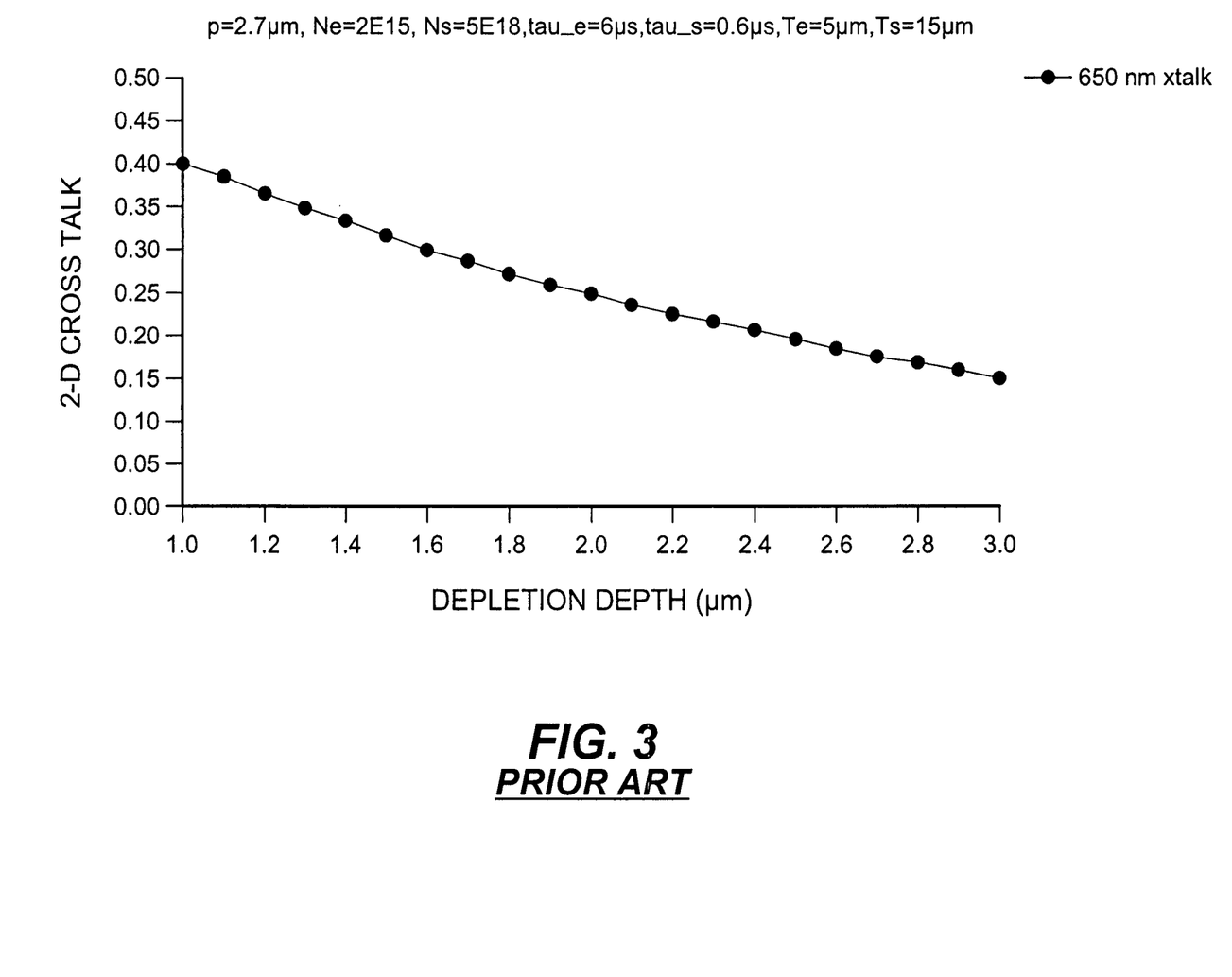
FIG. 3 illustrates example results of a 2-D calculation of pixel-to-pixel cross talk vs. depletion depth of a prior art CMOS active pixel image sensor pixel.

Cross talk can be quantified by defining it as the ratio of the signal in the non-illuminated to the illuminated pixel(s), and can be expressed as either a fraction or percentage. Therefore, cross talk represents the relative amount of signal that does not get collected by the pixel(s) under which it was generated. The dependence of cross-talk on depletion depth for the example prior-art pixel is illustrated in FIG. 3. The cross-talk calculation assumes that every other pixel along a line is illuminated (and the alternating, interleaved pixels are not). A wavelength of 650 nm is assumed, because cross talk is more of a problem at longer wavelengths because the optical absorption coefficient is lower at longer wavelengths, (i.e., the photons are absorbed deeper). It can be seen from this figure that although increasing the depletion depth can reduce cross talk, it does not go to zero even for depletion depths up to 3 um, which is approximately one over the absorption coefficient for silicon at 650 nm.

Figure 4A:
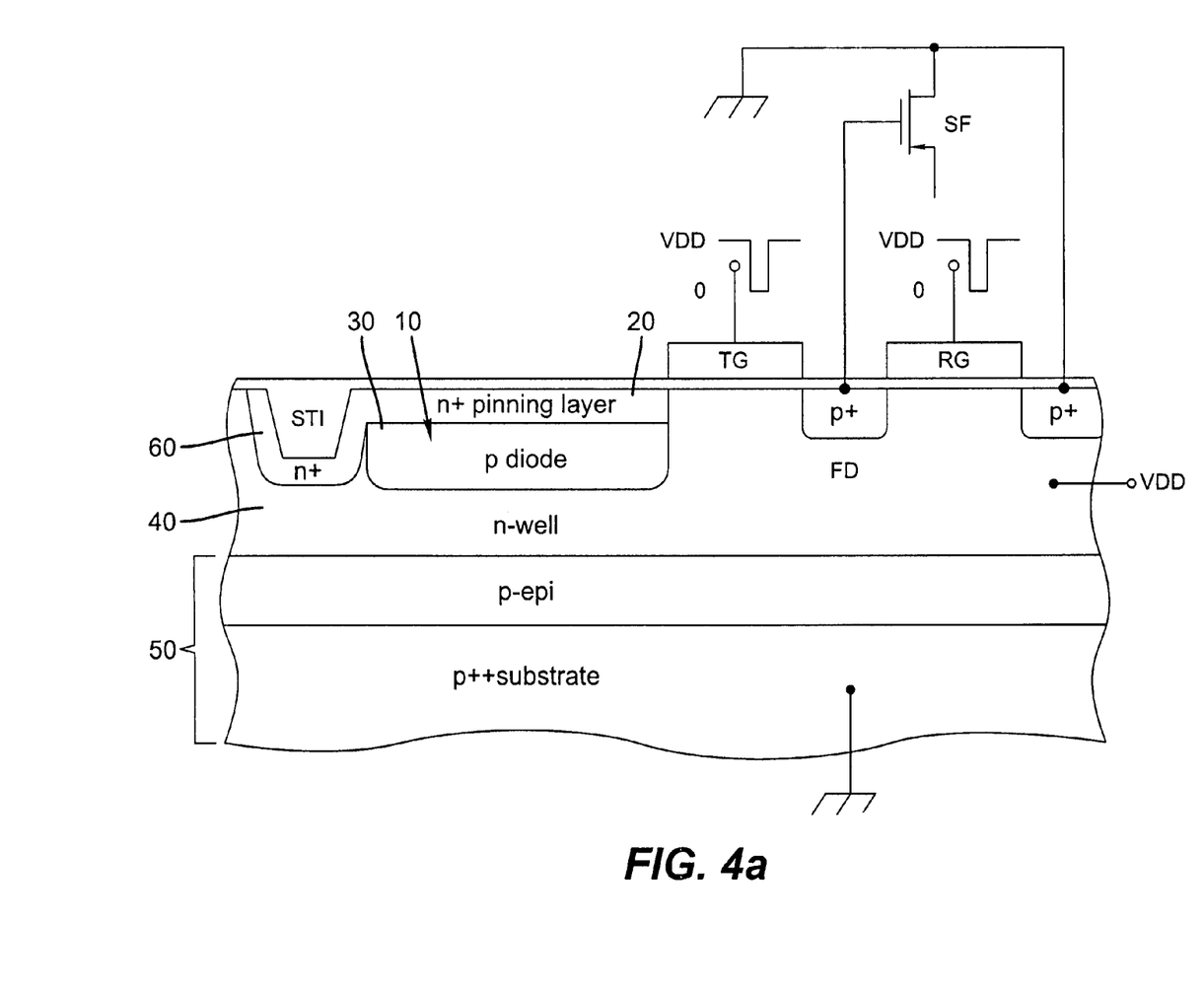
FIG. 4a shows a schematic view of a two-dimensional doping structure for the PMOS pixel structure of the present invention taken through a cross section through the transfer gate, floating diffusion, and reset gate.
Figure 4B:
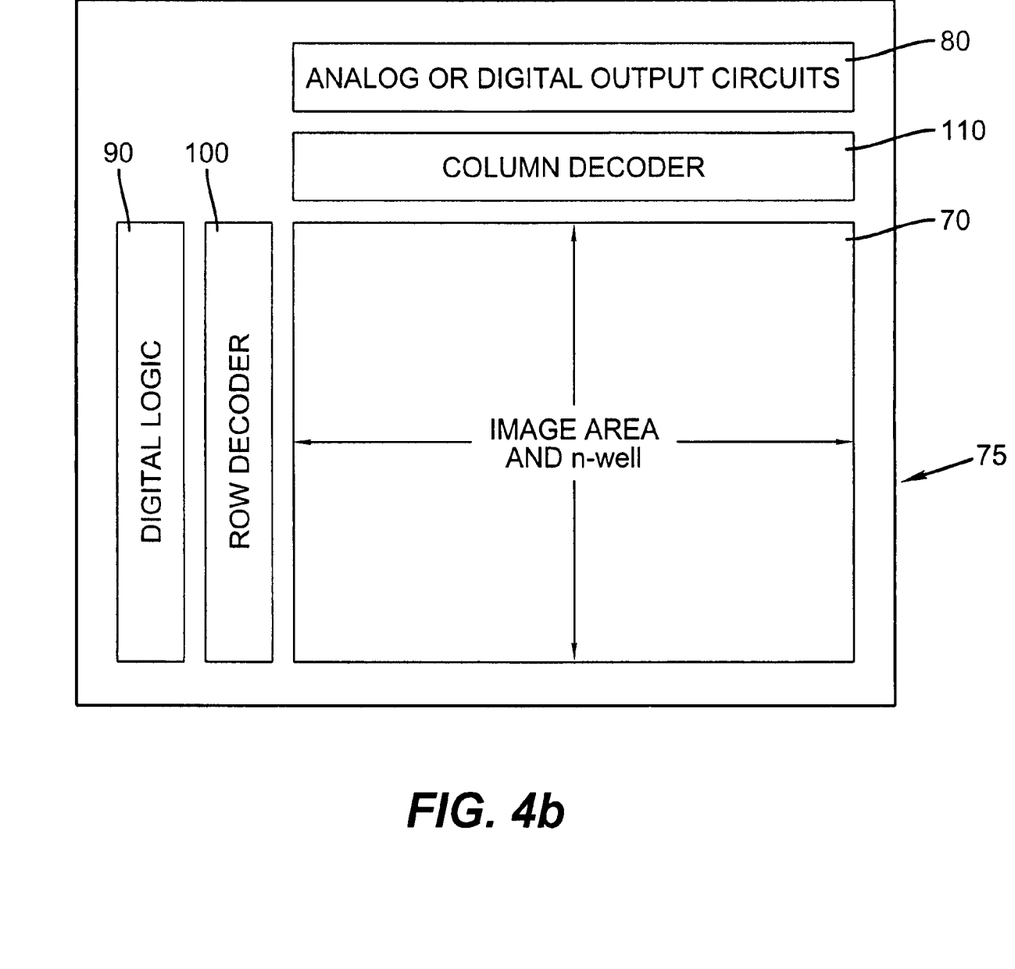
Figure 4C:
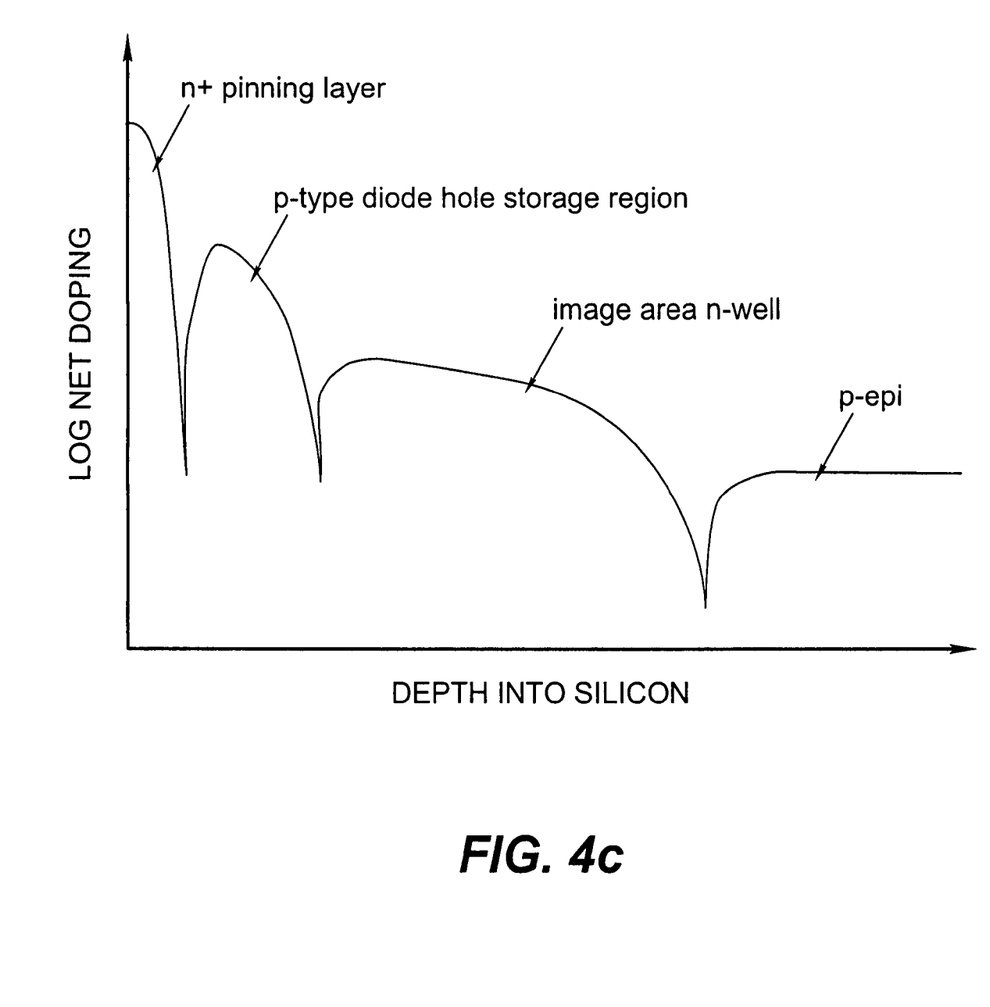
FIG. 4c shows the 1-D doping profile vs. depth into the silicon through the middle of the PMOS pixel structure of the present invention.
Figure 4D:
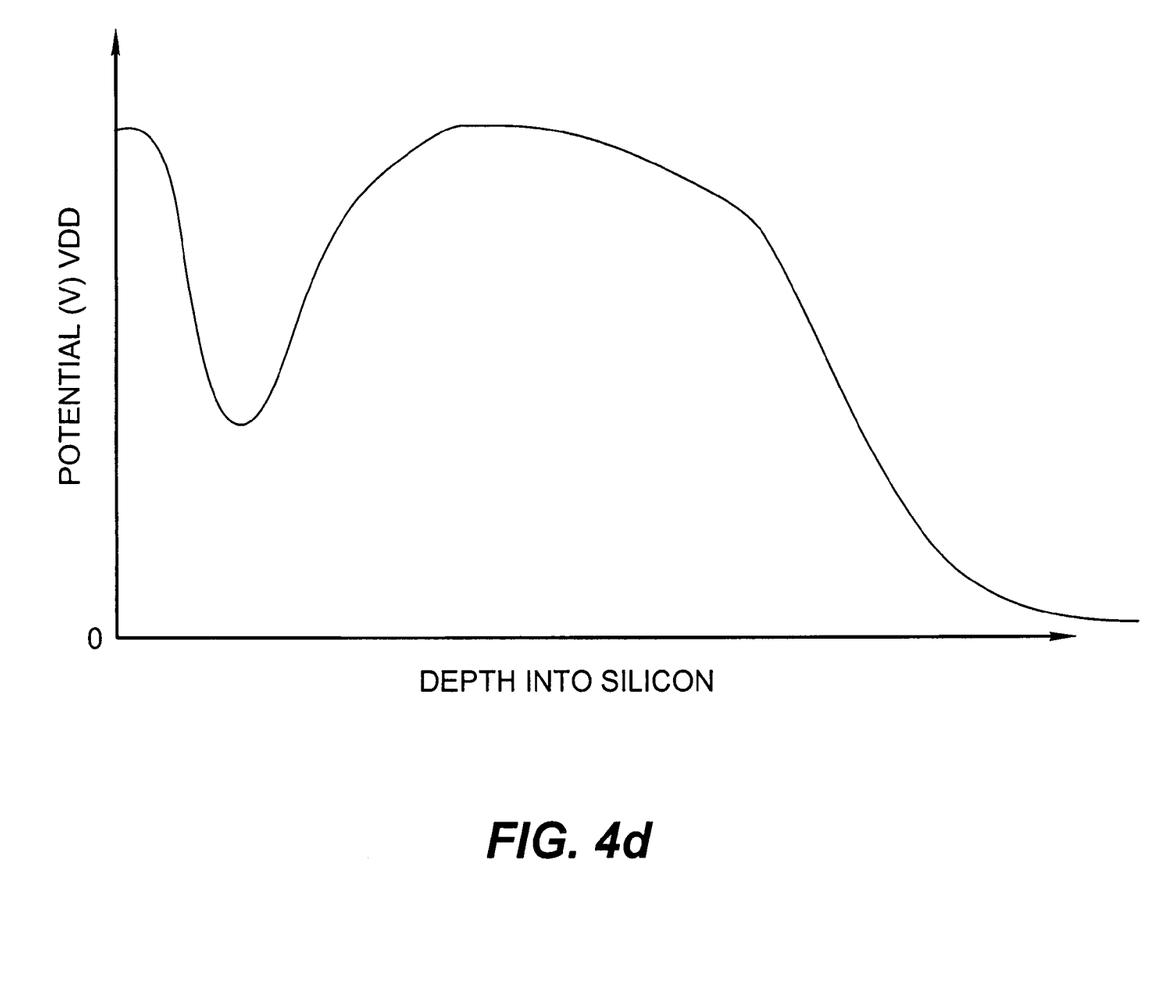
FIG. 4d shows the 1-D potential profile vs. depth into the silicon through the middle of the PMOS pixel structure of the present invention.

A cross section of the PMOS pixel architecture of the present invention is shown in FIG. 4a. The top view of an example CMOS image sensor containing this pixel structure is shown in FIG. 4b. An example doping profile down through the center of the photodiode is shown in FIG. 4c. An example potential profile down through the center of the empty photodiode is shown in FIG. 4d. As can be seen by FIGS. 4a and 4c, the pinned photodiode 10 of the present invention embodies an n+ pinning layer 20 and p-type buried storage region 30 built within an n-type well 40 on a p−/p++ epitaxial substrate 50. Because the photodiode's surface pinning layer 20 of the present invention is n-type, arsenic can be used. This makes it easier to create a shallow pinning layer due to the shorter implant range of arsenic compared to that of boron. (The prior art structure has a p-type pinning layer for which boron is typically used). Also, because the photodiode's storage region 30 is now p-type instead of n-type, boron can be used, (which has a longer implant range than phosphorous or arsenic as required for the storage region of the prior art structure), thereby making it easier to make this implant deep. The n+ pinning layer 20 is electrically connected to the n-well 40 via the n+ type isolation implant 60 around the typical shallow trench isolation (STI) region as can be seen in FIG. 4a. This pinning layer 20 maintains the surface of the diode in accumulation (of electrons). Signal charge is stored in the form of holes in the p-type buried storage region 30 of the pinned photodiode 10. The n-type well 40 is only formed in the image area 70 having a plurality of pixel as illustrated by the top view shown in FIG. 4b. By forming this well 40 only in the image area 70, the image sensor 75 uses standard mainstream CMOS devices and circuitry in the analog or digital circuits 80, digital logic 90, row decoder 100, and column decoder 110 while retaining all the benefits of a p-type substrate. It is preferable to form this n-well 40 at the beginning of the process so that its formation does not affect other device structures. For example, if it is formed via an implant and thermal drive, by doing this prior to the standard CMOS processing, the thermal drive step will not cause diffusion of shallow junction regions as required by the devices used in the CMOS support circuitry surrounding the image area. When formed in this n-well 40, the pixel's transfer gate (TG), reset gate (RG), and source follower (SF) transistors are all preferably p-type metal oxide silicon (note that the gate is not usually metal; it is polysilicon, and sometimes the dielectric is not solely oxide), field effect transistors (PMOS FETs). A row select transistor (RS not shown) in series with the output of the source follower amplifier (SF) would also be a PMOS device. All of the peripheral supporting CMOS circuitry 80, 90, 100 and 110 is formed within the p−/p++ epitaxial substrate. The substrate is at ground and the n-well 40 is biased at a convenient positive bias, such as VDD. After (or during) image integration, the floating diffusion (FD) is reset with a negative going pulse on the reset gate (RG) prior to signal transfer from the photodiode. A convenient FD reset voltage level is ground. After the floating diffusion is reset, (i.e., after the RG pulse), transfer of charge (holes) from the photodiode to floating diffusion is initiated by a negative going pulse on the transfer gate, TG. An example of convenient clock voltages (VDD) used for these pulses are shown in FIG. 4a. Other voltages may be possible without departing from the scope of the invention. Since the signal charge is holes for the present invention structure, the signal swing on the floating diffusion and source follower (SF) output will be positive going. Any photo signal (holes) that is generated within the n-well 40 beneath the photodiodes collecting region 30 is swept into the substrate 50 before it can diffuse to neighboring pinned photodiodes 10, thereby eliminating electrical cross talk. The signal would be read out from the chip in the usual manner as would be well known by those working in the art. The potential barrier between the substrate and photodiode that results from this structure also eliminates the diffusion component of dark current from the substrate (bulk) into the photodiode.

Figure 5:
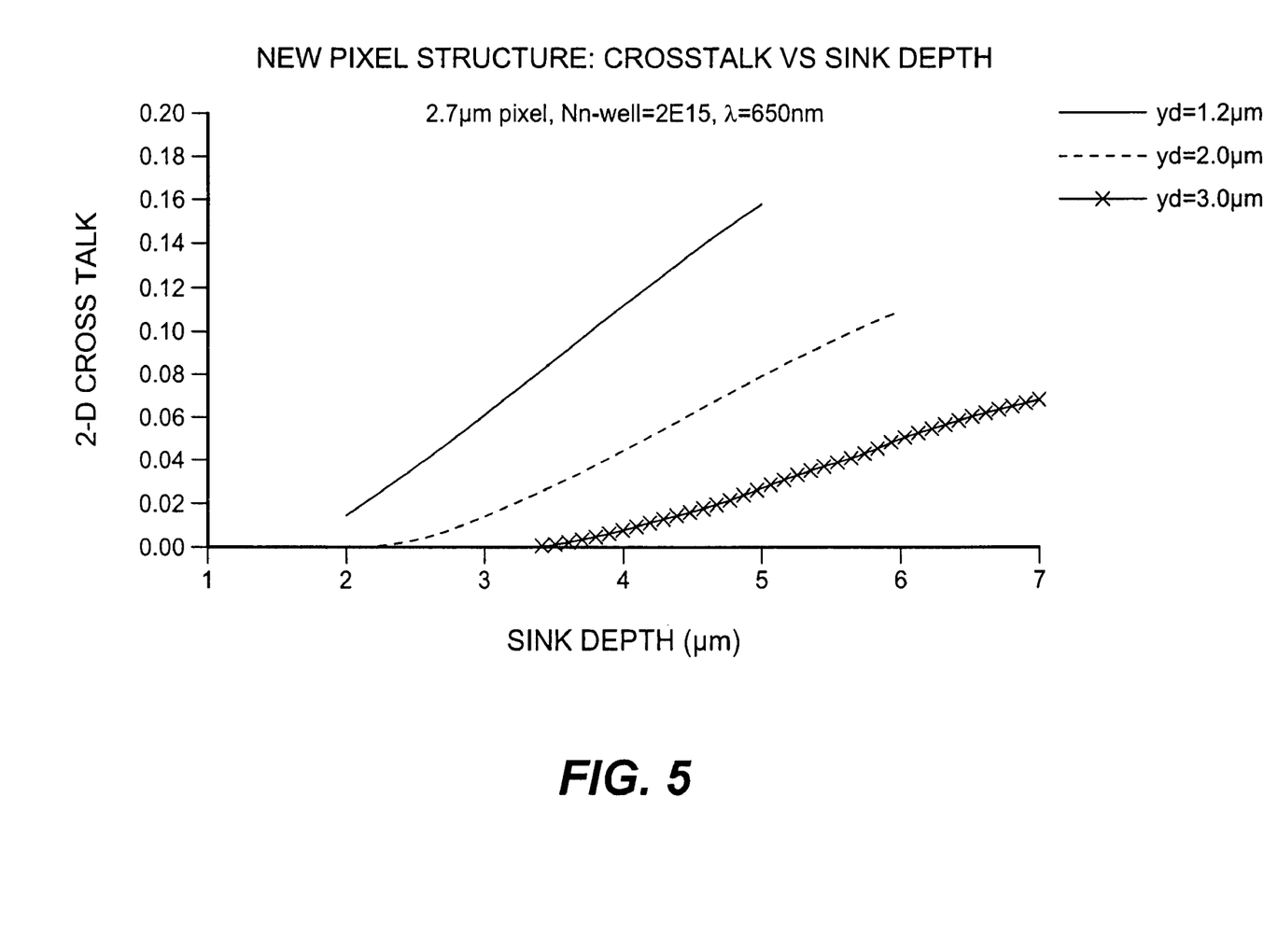
FIG. 5 shows the results of a 2-D calculation of pixel-to-pixel cross talk vs. overflow or sink depth for various photodiode depletion depths for the PMOS pixel structure of the present invention built in a well.

Electrical cross talk for the pixel structure of the present invention with a pinned photodiode built in an n-well on a p-type substrate is greatly reduced as shown in FIG. 5. Cross talk is shown versus sink depth (the depth past which carriers are drained to the substrate) for various depletion depths. The calculations are carried out by the methods described by E. G. Stevens and J. P. Lavine in *IEEE Trans. on Electron Devices*, vol. 41, no. 10, p. 1753, October, 1994. For this sample calculation, a constant n-well doping concentration vs. depth was assumed. For an actual device wherein the n-well would preferably be formed via ion implantation, the resulting doping gradient (such as shown in FIG. 4c) would create a potential gradient (as shown in FIG. 4d) such that minority carriers (holes) in the n-well would be driven into the substrate thereby resulting in the virtual elimination of electrical cross talk and the substrate dark current component.

Figure 6:
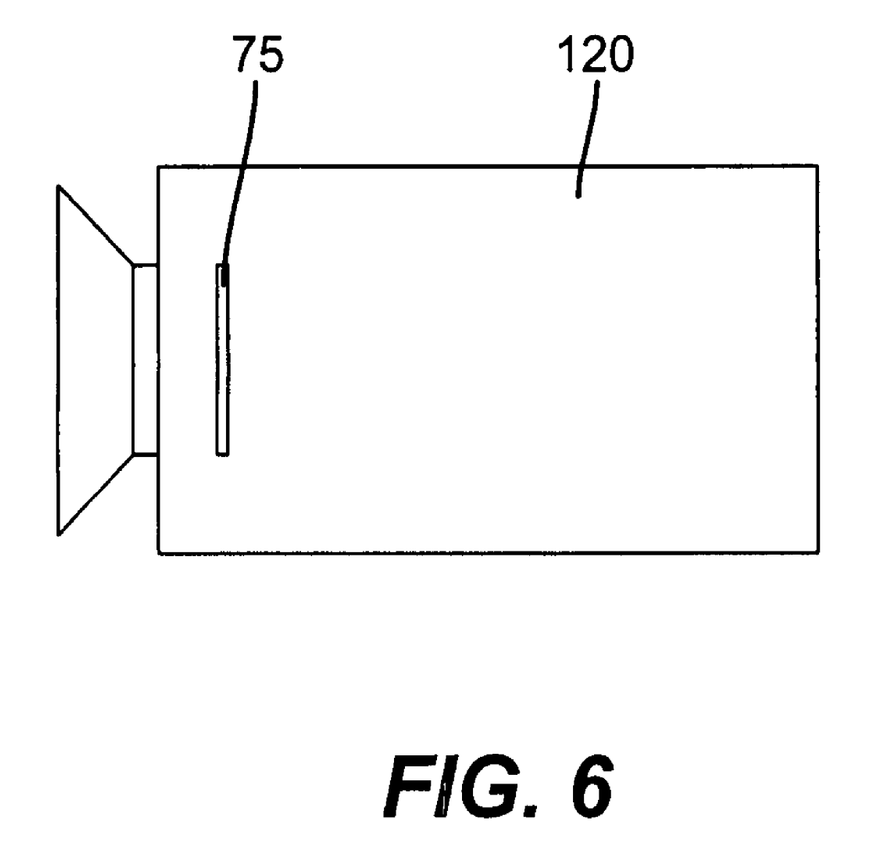
FIG. 6 is an illustration of a digital camera for illustrating a typical commercial embodiment of the present invention to which the ordinary consumer is accustomed.

Referring to FIG. 6, there is shown a digital camera 120 having an image sensor 75 of the present invention disposed therein for illustrating a typical commercial embodiment to which the ordinary consumer is accustomed.

Although the preferred embodiment of the present invention shown incorporates a pinned photodiode consisting of an n+ pinning (top surface) layer and a p-type buried collecting region within an n-well on a p-type epi substrate, it will be understood the those skilled in the art that other structures can be used without departing from the scope of the invention. For example, a simple unpinned p-type diode formed in an n-type well could be used, if desired. Also, although a simple non-shared pixel architecture is shown, a shared architecture, (such as U.S. Pat. No. 6,107,655 for example), could also be used without departing from the scope of the invention.

The invention has been described with reference to a preferred embodiment. However, it will be appreciated that variations and modifications can be effected by a person of ordinary skill in the art without departing from the scope of the invention.

PARTS LIST 10 pinned photodiode
20 n+ pinning layer
30 p-type buried storage region
40 n-type well
50 p−/p++ epitaxial substrate
60 n+ type isolation implant
70 image area
75 image sensor
80 analog or digital circuits
90 digital logic
100 row decoder
110 column decoder
120 digital camera

The invention claimed is:

1. Am image sensor with an image area having a plurality of pixels each having a photodetector of a p conductivity type, the image sensor comprising:
   (a) a substrate of the p conductivity type;
   (b) a first layer of n conductivity type between the substrate and the p-type photodetectors which use holes as charge carriers, wherein the first layer spans the entire image area having the plurality of pixels and includes doping that is graded so as to drive excess carriers into the substrate;
   (c) a contact electrically connected to the first layer for biasing the first layer at predetermined potential with respect to the substrate for driving excess carriers into the substrate to reduce cross talk;
   (d) one or more adjacent active P-channel Metal Oxide Semiconductor (PMOS) electronic components disposed in the first layer within each pixel; and
   (e) CMOS electronic support circuitry disposed in the substrate outside of the image area and electrically connected to the image area.

2. The image sensor as in claim 1, wherein the one or more active PMOS electronic components include a reset transistor and floating diffusion.

3. The image sensor as in claim 1, wherein the one or more active PMOS electronic components include an amplifier.

4. The image sensor as in claim 1 further comprising a p-epitaxial layer disposed between the substrate and the first layer; wherein the substrate is p+ type and the first layer is n-type.

5. The image sensor as in claim 1, further comprising a pinning layer of n conductivity type, wherein the photodetector is a pinned photodiode.

6. The image sensor as in claim 1, wherein the one or more active PMOS electronic components include a source follower amplifier.

7. The image sensor as in claim 5, further comprising a second layer of n conductivity type surrounding a bottom and sidewalls of each shallow trench isolation region to electrically conned the second layer of n conductivity type to the pinning layer and first layer of n conductivity type.

8. The image sensor as in claim 6, thither comprising a second layer of n conductivity type surrounding a bottom and sidewalls of each shallow trench isolation region to electrically conned the second layer of n conductivity type to the pinning layer and first layer of n conductivity type.

9. A camera comprising:
   an image sensor with an image area having a plurality of pixels each having a photodetector of a p conductivity type, the image sensor comprising:
   (a) a substrate of the p conductivity type;
   (b) a first layer of n conductivity type between the substrate and the p-type photodetectors which use holes as charge carriers, wherein the first layer spans the entire image area having the plurality of pixels and includes doping that is graded so as to drive excess carriers into the substrate;
   (c) a contact electrically connected to the first layer for biasing the first layer at predetermined potential with respect to the substrate for driving excess carriers into the substrate to reduce cross talk;
   (d) one or more adjacent active P-channel Metal Oxide Semiconductor (PMOS) electronic components disposed in the first layer within each pixel; and
   (e) CMOS electronic support circuitry disposed in the substrate outside of the image area and electrically connected to the image area.

10. The camera as in claim 9, wherein the one or more active PMOS electronic components include a reset transistor and floating diffusion.

11. The camera as in claim 9, wherein the one or more active PMOS electronic components include an amplifier.

12. The camera as in claim 9 further comprising an epitaxial layer disposed between the substrate and the first layer; wherein the substrate is p+ type and the first layer is n-type.

13. The camera as in claim 9, further comprising a pinning layer of n conductivity type, wherein the photodetector is a pinned photodiode.

14. The camera as in claim 9, wherein the one or more active PMOS electronic components include a source follower amplifier.

15. The camera as in claim 13, further comprising a second layer of n conductivity type surrounding a bottom and sidewalls of each shallow trench isolation region to electrically connect the second layer of n conductivity type to the pinning layer and first layer of n conductivity type.

16. An image sensor having an image area with a plurality of pixels, each pixel having a charge storage region of a p conductivity type, the image sensor comprising:
   a substrate of the p conductivity type;
   an epitaxial layer of the p conductivity type:
   a first layer of a conductivity type disposed between the p conductivity type epitaxial layer and the p conductivity type charge storage regions that use holes as charge carriers, wherein the first layer spans the entire image area having the plurality of pixels and includes doping that is graded so as to drive excess carriers into the substrate;
   a pinning layer of n conductivity type disposed over each p conductivity type charge storage region; and
   a contact electrically connected to the first layer for biasing the first layer at predetermined potential with respect to the substrate for driving excess carriers into the substrate to reduce cross talk.

17. The image sensor as in claim 16, further comprising one or more adjacent active P-channel Metal Oxide Semiconductor (PMOS) electronic components disposed in the n conductivity type first layer within each pixel.

18. The image sensor as in claim 16, further comprising Complementary Metal Oxide Semiconductor (CMOS) electronic support circuitry disposed in the p conductivity type substrate outside of the image area and electrically connected to the image area.

19. A method for operating an image sensor having a substrate of a p conductivity type, an image area with a plurality of pixels, each pixel having a charge storage region of the p conductivity type, a first layer of an n conductivity type disposed between the p conductivity type substrate and the p conductivity type charge storage regions that use holes as charge carriers, wherein the first layer spans the entire image area having the plurality of pixels and includes doping that is graded so as to drive excess carriers into the substrate, and a contact electrically connected to the first layer, the method comprising the step of:
   driving excess carriers into the substrate by applying a predetermined potential to the contact and biasing the first layer to the predetermined potential.

* * * * *